(12) United States Patent  
Frankowsky et al.

(10) Patent No.: US 7,409,308 B2  
(45) Date of Patent: Aug. 5, 2008

(54) METHOD AND DEVICE FOR VERIFYING OUTPUT SIGNALS OF AN INTEGRATED CIRCUIT

(75) Inventors: Gerd Frankowsky, Hoehenkirchen (DE); Roman Mayr, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/469,365

(22) Filed: Aug. 31, 2006

(65) Prior Publication Data

US 2008/0059102 A1 Mar. 6, 2008

(51) Int. Cl.
*G06F 19/00* (2006.01)

(52) U.S. Cl. ...................................... 702/117; 702/124

(58) Field of Classification Search ................ 702/108, 702/124, 125, 117; 714/724, 740; 324/754, 324/763

See application file for complete search history.

(56) References Cited

U.S. PATENT DOCUMENTS

| | | | |
|---|---|---|---|
| 4,849,973 A | 7/1989 | Kubota | |
| 5,578,935 A * | 11/1996 | Burns | 324/763 |
| 6,201,746 B1 | 3/2001 | Koo et al. | |
| 7,032,151 B2 * | 4/2006 | Halder et al. | 714/740 |
| 2005/0114734 A1 * | 5/2005 | Beer et al. | 714/30 |
| 2007/0159234 A1 * | 7/2007 | Heinen et al. | 327/537 |

* cited by examiner

*Primary Examiner*—Bryan Bui
(74) *Attorney, Agent, or Firm*—Patterson & Sheridan, L.L.P.

(57) ABSTRACT

A system and method for testing an integrated circuit is provided. In one embodiment, a method includes comparing the signal level of the output signal of the integrated circuit to the signal level of a reference signal, wherein a comparison signal is output, which has a first or a second value depending on whether the actual signal level of the output signal is above or below the actual signal level of the reference signal; determining the value of the comparison signal at a certain time; evaluating the value of the comparison signal determined at the time by way of a default; and outputting an error signal if the determined value of the comparison signal does not correspond to the default.

34 Claims, 6 Drawing Sheets

METHOD AND DEVICE FOR VERIFYING OUTPUT SIGNALS OF AN INTEGRATED CIRCUIT

BACKGROUND OF THE INVENTION

1. Field of the Invention

The invention relates to an evaluation method and an evaluation device for output signals of an integrated circuit, especially of a digital data signal of a semiconductor storage circuit.

2. Description of the Related Art

In the past, advances in manufacturing integrated circuits have resulted in exponential increase of the clock frequencies. In addition, the data transfer speed of these circuits increased exponentially. Thus, particularly in state-of-the-art semiconductor memories, data transfer rates in the range of 1 Gigabit per second already occur on a data transfer channel.

However, in semiconductor storage circuits operated with high frequencies interfering factors increasingly occur, such as signal cross-talk or electromagnetic pulses rendering detection of a signal difficult.

By internal signal processing of an integrated circuit, signals are processed in a preset manner and output as defined output signals. The amplitude and the behaviour of the output signal of the integrated circuit are defined by corresponding reference voltage levels in the associated component specification. Upon reading the output signal, by way of comparison of the measured voltage level of the output signal to the reference voltage level, it can be verified if the output signal is above or below the reference voltage preset by the specification, respectively. As a result of this comparison, it is decided if a digital output signal represents a logical "1" or a logical "0". Due to various influences, which may occur in a real system, short-term signal variations can occur. This in turn can result in errors in interpretation of the corresponding signals. Therefore, it is necessary to identify such erroneous signals and the optionally also erroneous circuit portions of the integrated circuit. Usually, this is effected with the aid of a compliance test.

In a conventional compliance test an attempt is made to sample the signal with high accuracy in order to obtain an idea of the signal behaviour as accurately as possible. The individual measurement points are stored. Subsequently, the region in which the data eye is opened is determined by way of the measurement data. For testing the signal, it is verified if the mask defined by the component specification fits in the data eye reconstructed from the measurement data. Since the accuracy of such a test method is primarily determined by the amount of acquired measurement data, inevitably, it is necessary to acquire the signal with a sampling frequency and resolution as high as possible. Due to the technical and temporal effort required for such a measurement, the conventional test method is not suitable for the production in high volume. Rather, up to now, the compliance test is performed in a separate procedure succeeding the production. This requires additional test time.

However, detailed acquisition of the time/voltage values is only reasonable in case of characterization of a component, especially, if certain characteristics of the component are to be analyzed by the exact analysis of the data eye. However, for production in high volume, this type of analysis is not required. Here, a simple "pass/fail" result is sufficient, with which a statement is possible of whether the output signal of the concerned component corresponds or not to the specification.

SUMMARY OF THE INVENTION

The present invention generally provides methods and devices for testing an integrated circuit.

For one embodiment of the invention, a method for testing an integrated circuit includes comparing the signal level of an output signal of the integrated circuit to the signal level of a reference signal, wherein a comparison signal is output, which has a first or a second value depending on whether the actual signal level of the output signal is above or below the actual signal level of the reference signal; and further including determining the value of the comparison signal at a certain time, and evaluating the value of the comparison signal determined at the certain time by way of a default.

For another embodiment of the invention a device for testing an integrated circuit includes a comparator to compare the signal level of an output signal of the integrated circuit to a signal level of a reference signal, wherein the comparator is formed to output a comparison signal at its signal output, which has a first or a second value depending on whether the actual signal level of the output signal is above or below the actual signal level of the reference signal, a sampling means to determine the value of the comparison signal at a certain time, and an evaluation circuit to evaluate the value of the comparison signal determined at the certain time by way of a default.

BRIEF DESCRIPTION OF THE DRAWINGS

These and other features of the present invention will become clear from the following description taken in conjunction with the accompanying drawings. It is to be noted, however, that the accompanying drawings illustrate only typical embodiments of the present invention and are, therefore not to be considered limiting of the scope of the invention. The present invention may admit other equally effective embodiments.

DETAILED DESCRIPTION OF THE PREFERRED EMBODIMENT

An integrated circuit can be tested by simulating a certain operation of the circuit and examining the output signals at the signal output of the circuit. Therein, the temporal behaviour of the output signal is characterized by way of a default of the specification. The characterization of electrical signals is usually effected by way of a time voltage diagram. Such a diagram shows the temporal variation of the signal level of the respective signal in a certain time period. In high frequency signals usually being transmitted in the form of differential signals, the output signal is formed of two oppositely directed signal branches typically being transmitted through two adjacent signal lines. The characterization of a differential signal is often effected with the aid of an eye diagram, in which the two oppositely directed signal branches are represented in a common time voltage diagram. In a digital circuit, the differential output signal usually has a sequence of eye openings each being defined by two crossing points of the two oppositely directed signal branches. Therein, the data eyes represent signal portions with a preset length. Each signal portion designates the time voltage range, in which the signal represents a logical "1" or a logical "0", respectively. How a signal portion has to look to be able to be recognized as a logical "1" or a logical "0", respectively, is usually predefined by the specification. Usually, plural points of the data eye are set therein with the aid of a so-called compliance mask. Therein, the points define certain time distances and signal levels of the signals. With the aid of the compliance test, the individual signal portions of the signal are checked for meeting these defaults.

Figure 1A:
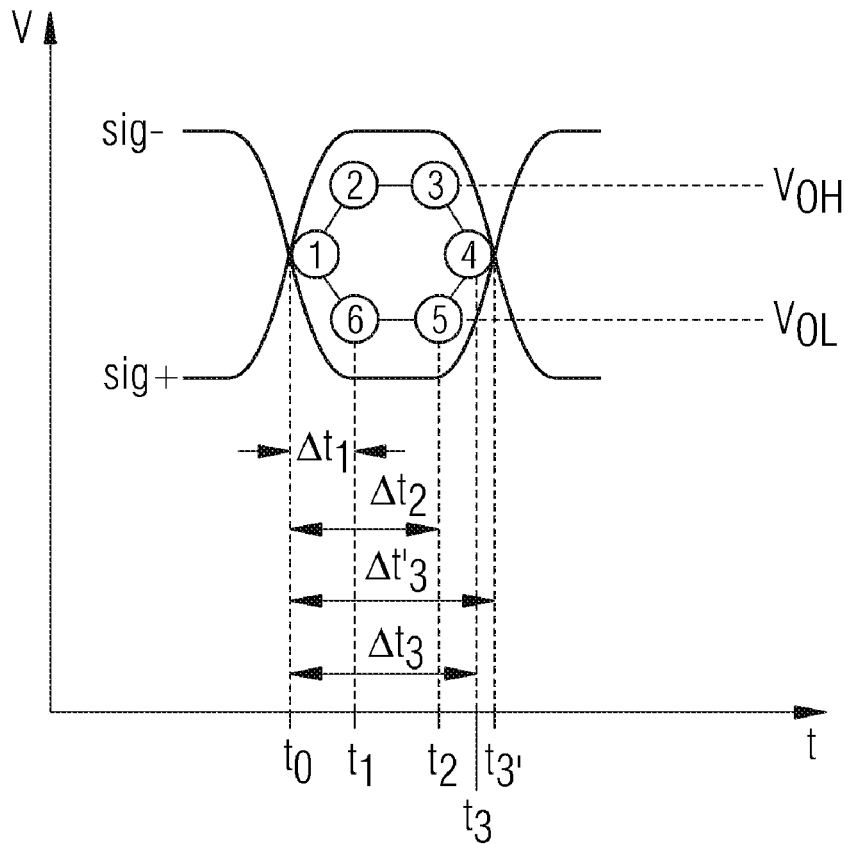
FIGS. 1A and 1B show exemplarily two compliance masks for characterizing a differential signal.
Figure 1B:
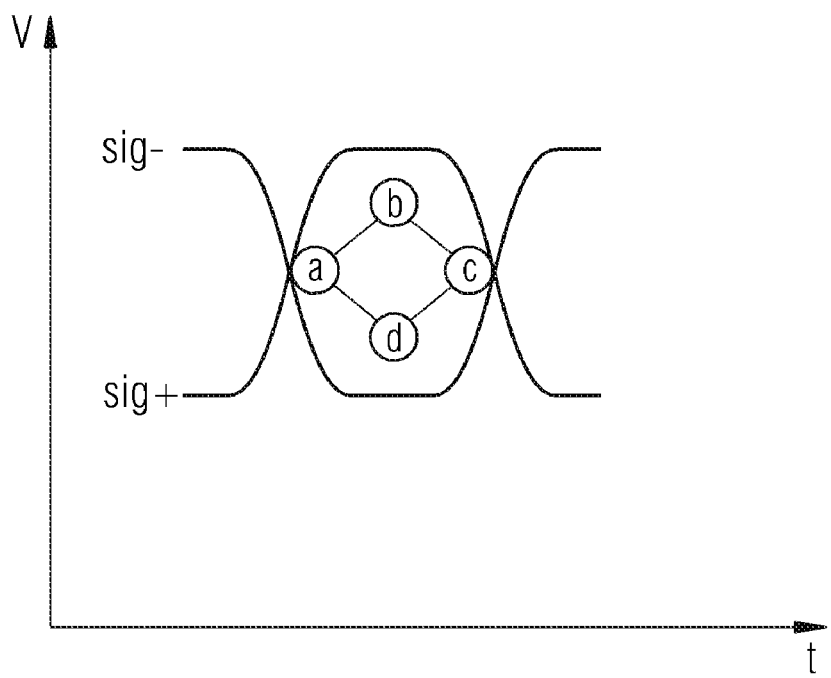

FIGS. 1A and 1B show exemplarily two such compliance masks used for definition of a data eye. Therein, according to the application, masks with a varying number of sampling points can be employed. In the compliance mask shown exemplarily in FIG. 1A, 6 points are used for definition of the eye opening. On the other hand, the eye opening shown in FIG. 1B is set with the aid of four mask points.

The method, which is explained in the following merely on the example of the 6 point mask, can be applied to any compliance masks. Therein, both differential signals and so-called single-ended signals can be verified by way of a default.

As the diagram in FIG. 1A shows, the characterization of the data eye of a differential signal sig+, sig−, is effected in the present example by way of 6 mask points. These points are typically arranged at characteristic locations of the signal. Thus, the points 1 and 4 set the minimum duration $\Delta t3'$ of the data eye. Therein, the duration of a data eye corresponds to the time distance of two crossing points of the two oppositely directed branches sig+, sig− of the differential signal. A data eye with shorter duration than the preset minimum duration $\Delta t3'$ could result in problems in interpretation of the datum represented by the respective data eye. On the other hand, the points 2, 3, 5 and 6 of the compliance mask define minimum or maximum levels of the two oppositely directed signal levels sig+, sig− at the preset times t1 and t2, respectively. Therein, the two points 2 and 3 of the mask preset an upper threshold value VOH, below which the signal level of the positive branch sig+ of the differential signal is not allowed to fall at the time t1 or t2, respectively, in order that the corresponding signal portion is correctly recognized as a logical "1" or a logical "0". The same applies to the two points 5 and 6, which preset a lower threshold value VOL, which the negative branch sig− of the differential signal is not allowed to exceed at the two times t1 and t1. The two periods of time $\Delta t1$ and $\Delta t2$ define the respective time distance of the measurement points 2 and 6 or 3 and 5, respectively, at a measurement point 1 of the compliance mask defined by the crossing point of the two signal branches sig+, sig−. The period of time $\Delta t3$ is slightly smaller than the period of time $\Delta t3'$ and defines a time t3, with the aid of which the duration of a data eye is verified.

On the other hand, the compliance mask shown in FIG. 1B has only 4 points, by which the characteristics of the data eye are set. Herein, the points a and c predefine the minimum duration of the data eye, and the points b and d predefine two threshold values for the two signal branches of the differential signal. Such a mask can, e.g., be used if only achieving a certain voltage level is crucial and not retaining a voltage level for a preset period of time.

The method according to the invention provides that the points of a signal portion preset by the compliance mask are sampled and therein it is verified if the signal level of a signal in these points corresponds to the default. Therein, the test of an output signal of an integrated circuit can be effected with the aid of the proposed test device. For verifying the individual points of the compliance mask, this test device preferably has various circuit portions. In the following, the individual circuit portions of the proposed test device are described in more detail. Therein, also the method according to the invention is explained by way of signals of the respective circuit portions.

Figure 2:
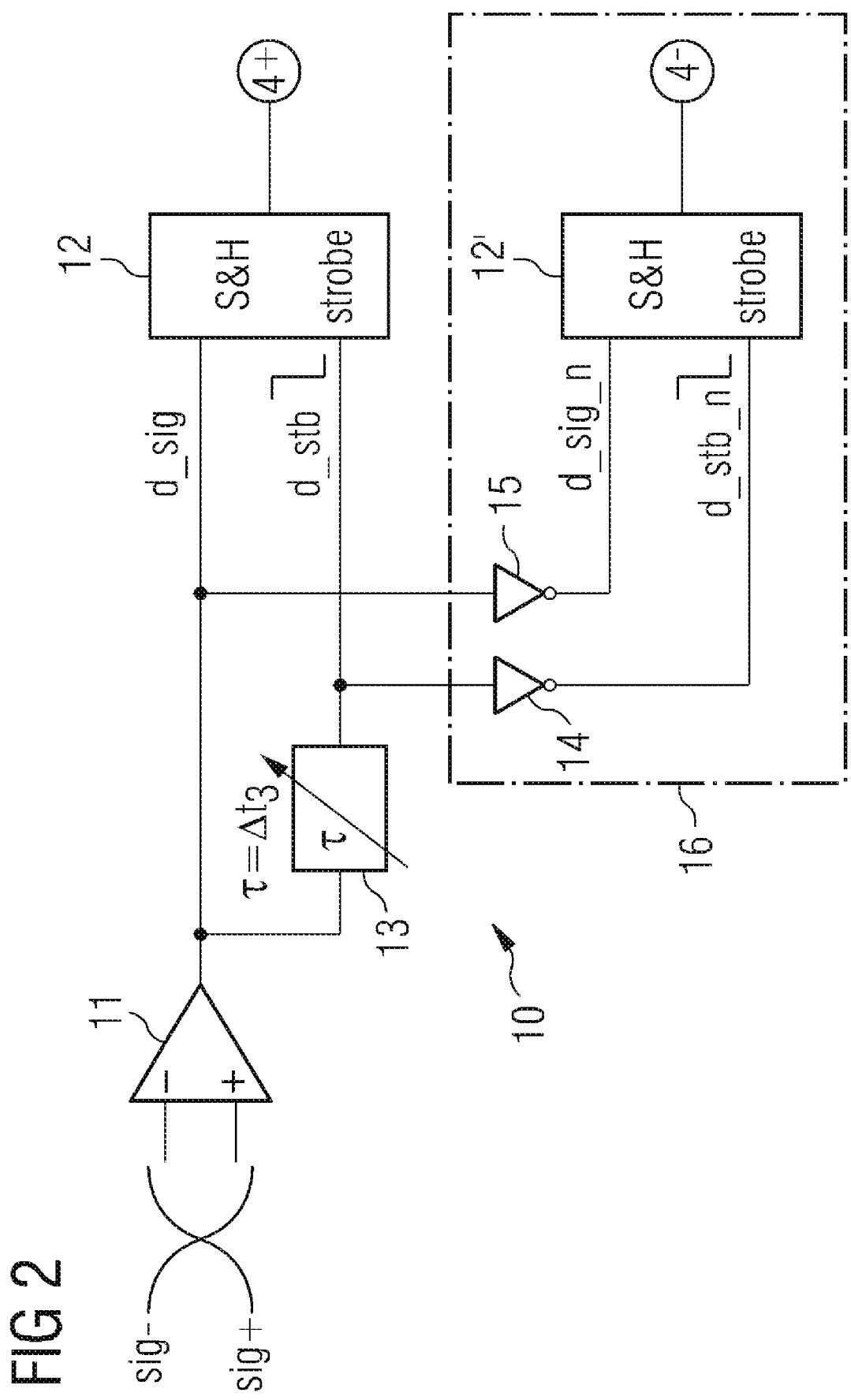
FIG. 2 shows a first circuit portion of the test device according to the invention for testing a preset signal duration.

FIG. 2 shows a first circuit portion 10 of the test device 1 according to the invention. This circuit portion 10 serves for verifying the data eye duration of the output signal to be tested. The first circuit 10 includes a first comparator 11, two sampling means 12, 12', an adjustable delay member 13 as well as two inverters 14, 15. The comparator 11 constitutes the input stage of the first circuit portion 10, through which the signals to be tested are coupled. For this, two signal inputs are provided, at which the output signal of the integrated circuit 2 and a reference signal are applied. As is the case in the present example, if the output signal sig+, sig− is a differential signal, preferably the two oppositely directed branches sig+ and sig− of the differential signal are applied to the two inputs of the comparator 11. However, it is also possible to apply only the positive signal branch sig+ or the negative signal branch sig− to one of the signal inputs of the comparator, respectively, while a reference signal, e.g. a signal the constant signal level of which is between the maximum and the minimum signal level of the respective signal branch, is applied to the other signal input.

The comparator 11 represents an electronic circuit, which compares the signal levels of the two signals sig+, sig− applied to its signal inputs to each other. As a result of this comparison, the comparator provides a comparison signal at its signal output, which indicates which signal level of the two signals is higher. A typical comparator has a non-inverting and an inverting input. If the signal level of the signal at the non-inverting input is higher than the signal level of the signal at the inverting input, the comparator 11 outputs the positive supply voltage at its signal output. In the inverse case, the output voltage goes towards the negative supply voltage. The output signal of the comparator thus only has two values, according to which one of the two input signals has a higher actual signal level. Thereby, the comparison signal d_sig of the comparator 11 represents a digital signal, from which the signal behaviour of the two input signals can no longer be reconstructed. Therein, the comparator 11 operates very quickly. Even if the signal level ratio of the input signals sig+, sig− is very low and changes in short time, the full positive or negative supply voltage is directly applied to the signal output of the comparator 11. The output signal of the comparator therefore has steep edges.

The comparator 11 can e.g. be realized as an operational amplifier. Without negative feedback, such an operational amplifier can be operated with very high gain. However, for high frequency signals, comparators are preferably employed, which are optimized for particularly fast switching.

The signal output of the comparator 11 is connected to a signal input of a sampling means 12. With the aid of the means 12 preferably formed as a sample & hold circuit, the signal level of the comparison signal d_sig is to be determined at certain times t3. For this, the sampling means 12 is formed such that the signal level of the comparison signal d_sig respectively currently applied to its signal input is applied to its signal output and held there for a certain time period as soon as the sampling means 12 is triggered. For controlling the sampling, the sampling means 12 has a control input also connected to the signal output of the first comparator 11 through a delay member 13. According to the invention, the comparison signal d_sig delayed by a preset period of time Δt3 is used as a control signal d_stb for determining the sampling time t3 of the respective signal portion. Fundamentally, the sampling means 12 can also be controlled with the aid of another control signal instead of the delayed comparison signal d_sig. However, optionally, further circuits are then required for synchronizing the signals. Since this is not required in the present solution, the embodiment of the device 2 according to the invention shown here is especially characterized by its simple construction.

The delay member 13 is preferably formed adjustably. This is suggested by an arrow in FIG. 2. Hereby, the test device 1 can be adjusted to various output signals.

If the sampling means 12 is only formed as a simple sample & hold circuit, which only triggers to the falling or to the rising signal edge of the control signal d_stb, only every other data eye is sampled. In order to also sample the missing data eyes, preferably, an additional circuit portion 16 with an additional sampling means 12' is provided. Therein, the additional sampling means 12' can be formed such that it is triggered to the opposed signal edge of the control signal d_stb as the first sampling means 12. In order to achieve a construction as simple as possible, the additional sampling means 12' is preferably constructed analog to the first sampling means 12. Then it is required to invert the comparison signal d_sig and the control signal d_stb with the aid of two inverters 14, 15 to achieve sampling of each data eye. By the inverted control signal d_stb_n, a rising signal edge is applied to the control input of the further sampling means 12', if a falling signal edge is applied to the control input of the first sampling means 12, and vice versa.

Thus, the signal levels of the mask points 4+, 4− of two adjacent data eyes A to G each determined at the certain times t3 are applied to the signal outputs of the first and the additional sampling means 12, 12'.

For evaluating the determined signal levels, an evaluation device 60 is provided, wherein each signal output of the two sampling means 12, 12' is preferably connected to a separate input of the evaluation means 60. The evaluation device 60 compares the determined value of the respective sampling means 12, 12' to a corresponding default. As a result of the evaluation, the evaluation means 60 outputs a corresponding evaluation signal at its signal output 61. Preferably, it is an error signal indicating that at least one of the values determined by the two sampling means 12, 12' does not correspond to the default.

Fundamentally, the additional circuit portion 16 shown in FIG. 2 can also be omitted if the first sampling means 12 can be triggered both to the falling and the rising signal edge of the control signal d_sig.

Figure 3:
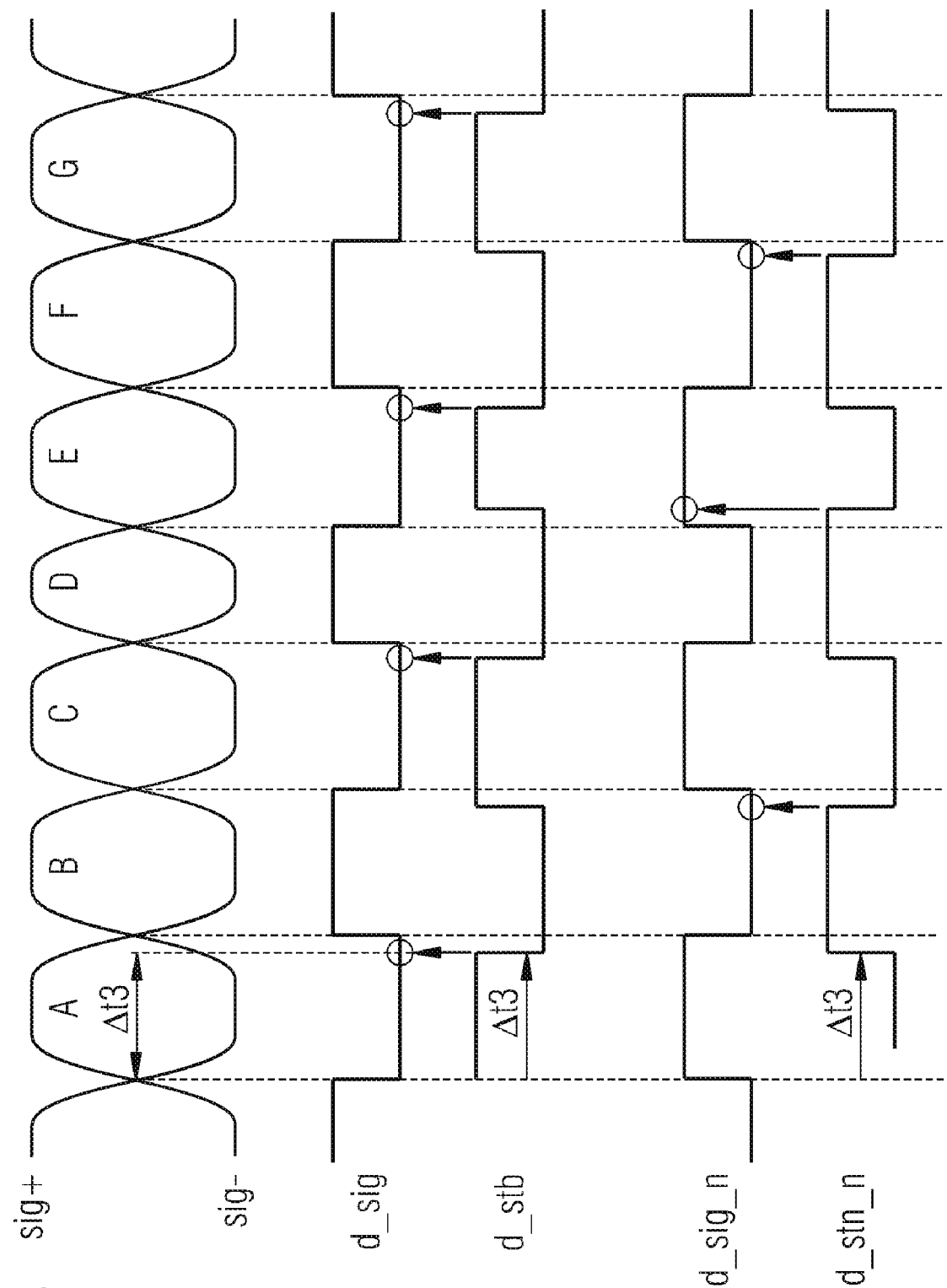
FIG. 3 illustrates the temporal behaviour of the signals associated with the first circuit portion of the test device according to the invention.

FIG. 3 exemplarily shows the behaviour of the signals sig+, sig−, d_sig, d_stb, d_stb, d_sig and d_stb_n of the first circuit portion 10 of the test device 1 according to the invention shown in FIG. 2. Therein, in the upper portion of the diagram, the differential output signal sig+, sig− of the integrated circuit 2 is presented. The circuit 2 to be tested is preferably operated during the compliance test such that a preset sequence of data eyes A-G is output at its signal output. Such a regular sequence of data eyes A-G, as shown here, is particularly well suitable for the upcoming compliance test. However, the method according to the invention is not only dependent on regular output signals. Rather, the output signal sig+, sig− to be tested can also have any behaviour. Thus, e.g. an irregular or even a random sequence of data eyes is possible. This signal behaviour has then to be taken into account correspondingly in evaluation.

However, the first comparison signal d_sig only has two values, a high and a low value, according to which one of the two signal branches sig+, sig− of the output signal currently has a higher signal level. The first comparison signal d_sig changes its value as soon as the signal level of the positive signal branch sig+ falls below the signal level of the negative signal branch sig−, and vice versa. The typical signal behaviour of the comparison signal d_sig therefore corresponds to a binary signal with steep signal edges. Due to the substantially equal duration of the signal portions A-G of the output signal sig+, sig− determined by the data eyes, also the signal portions of the comparison signal d_sig limited by the signal edges illustrated in FIG. 3 have substantially equal duration.

For verifying if the duration of a data eye does not fall below the preset minimum duration Δt3', the first comparison signal d_sig is sampled with the aid of the first sampling means 12 at a certain time t3. Therein, the time t3 is a preset period of time Δt3 after a reference time t0, which is determined by the beginning of the respective data eye A-G. Therein, the reference times t0 for the four signal portions A, C, E, G are each preset by the falling edges of the first comparison signal d_sig. On the other hand, the reference times t0 for the three periods of time B, D, F are each determined by a rising edge of the comparison signal d_sig. Preferably, for determining the respective sampling time t3, the comparison signal d_sig delayed by means of the adjustable delay member 13 by the preset period of time Δt3 is used as the control signal d_stb for the first sampling means 12. Therein, the falling or rising edge of the control signal d_stb, respectively, serves as a trigger event for the first sampling means 12. As is suggested by corresponding arrows in FIG. 3, a "low" value of the comparison signal d_sig is respectively determined for the data eyes A, C, E, G in sampling. This result shows that the duration of the periods of time A, C, E, G each corresponds to the default. The default of the specification verified by the evaluation means 60 provides that the comparison signal d_sig has a "low" value at the time t3 of each of the signal portions A, C, E, G. Only in this case, the evaluation means 60 does not generate an error signal in evaluating the four sampling results.

Therein, the preset period of time Δt3 should preferably be selected slightly shorter than the preset minimum duration Δt3' of the data eyes A-G. Upon delay of the comparison signal d_sig by the preset minimum duration Δt3', the sampling would be effected directly in the crossing point of the two signal branches sig+, sig−. Due to small deviations, which are well within the tolerance range preset by the specification, the sampling could also be effected after the crossing point of the two signal branches sig+ and sig−. Therein, a "high" signal level of the comparison signal d_sig would be determined. The evaluation means would then output an error signal although the actual duration of the corresponding data eye A-G would still be within the tolerance range of the specification.

Since the first sampling circuit 12 is only triggered to the falling edges of the control signal d_stb, it only samples the data eyes A, C, E, G. In order to also acquire the other data eyes B, D, F, the comparison signal d_sig and the control signal d_stb are inverted and supplied to the additional sampling means 12'. Therein, the sampling is effected similarly to the already described sampling of the first sampling means 12 respectively to the falling edge of the control signal d_sig_n. As is shown in FIG. 3, the fourth data eye D has a shorter duration compared to the other data eyes A, B, C, E, F, G. As a result of this deviation, in sampling the inverted comparison signal d_sig_n, a "high" signal level instead of a "low" signal level is determined. This deviation is recognized as an error in the evaluation means 60 corresponding to the default. Therefore, at the signal output 61 of the evaluation means 60, an error signal is output at the corresponding time.

Fundamentally, with the aid of the concept described here, meeting a maximum duration of the signal can also be verified. Further, also a combination of the two methods is possible in that the respective comparison signal is sampled both short before and short after a preset signal duration. The verification of the maximum duration can optionally be effected with a further circuit analogous to the first circuit portion 10.

Figure 4:
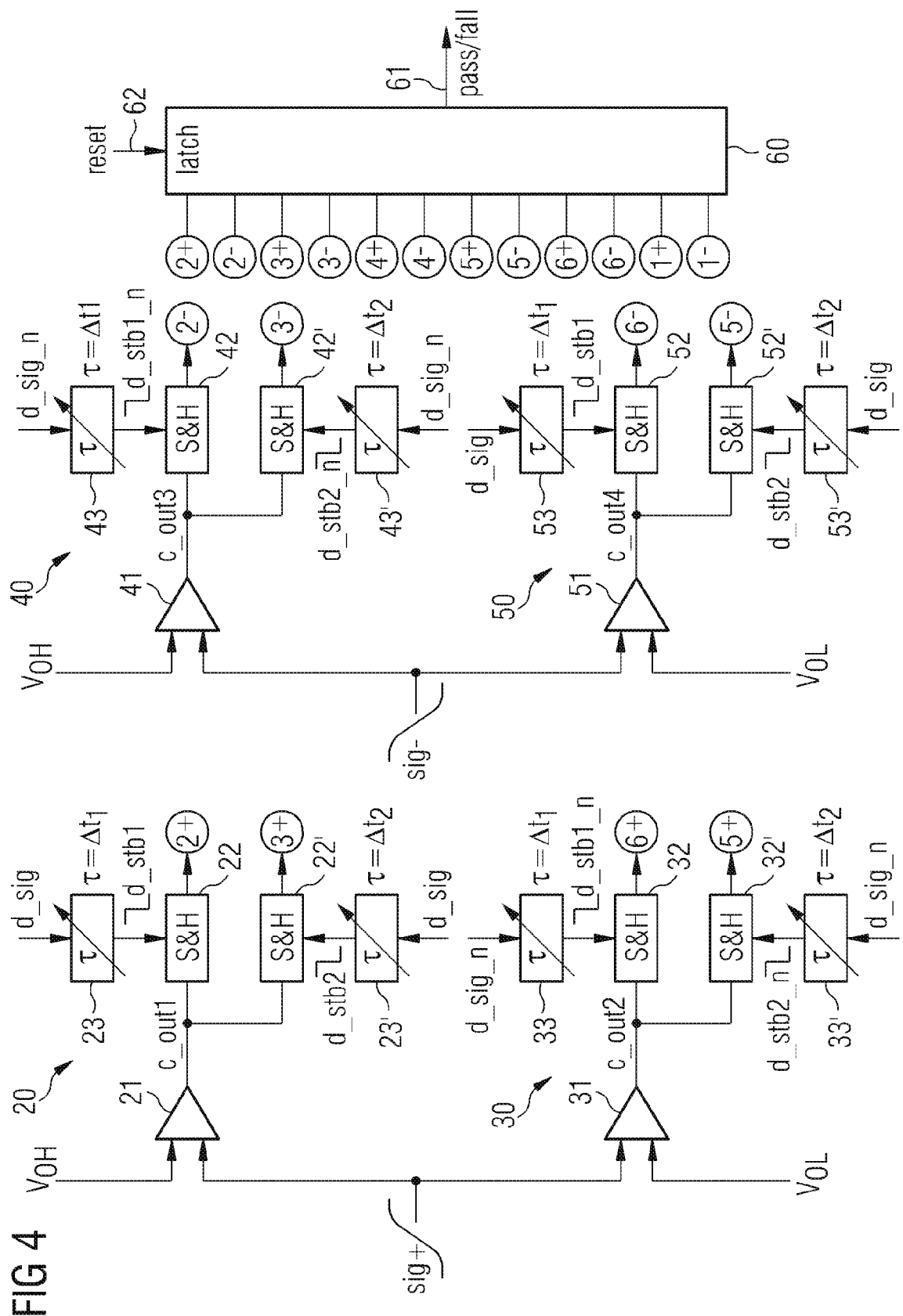
FIG. 4 shows further circuit portions of the test device according to the invention for testing the signal level of the output signal.

In order to also verify meeting of certain signal levels of the output signal sig+, sig− of the integrated circuit 2, further circuit portions are provided. FIG. 4 shows exemplarily four circuit portions 20, 30, 40, 50, with the aid of which meeting the default preset with respect to the mask points 2, 3, 5 and 6 of the compliance mask is respectively verified. Therein, the two signal branches sig+ and sig− are each compared to an upper and a lower threshold value VOH, VOL preset by the compliance mask. Therein, the second and the third circuit portion 20, 30 sample the positive signal branch sig+, while the fourth and the fifth circuit portion 40, 50 are responsible for the negative signal branch sig− of the output signal. Therein, the second circuit portion 20 verifies the mask points 2 and 3 of the positive signal branch sig+ by way of the preset upper threshold value VOH, while the third circuit portion 30 is responsible for verifying the mask points 5 and 6 of the positive signal branch sig+ by way of the preset lower threshold value VOL. In analogous manner, the fourth circuit portion 40 is responsible for verifying the mask points 2 and 3 and the fifth circuit portion 50 is responsible for verifying the mask points 5 and 6 of the negative signal branch sig− by way of the preset upper or lower threshold value VOH, VOL, respectively.

Therein, the four circuit portions 20, 30, 40, 50 have a substantially equal construction. A comparator 21, 31, 41, 51 each constitutes the input stage, at the signal inputs of which each one signal branch sig+ or sig− and a constant reference signal VOH, VOL is applied. The respective comparison signal c_out1, c_out2, c_out3 and c_out4 is sampled with the aid of a corresponding sampling means 22, 22', 32, 32', 42, 42', 52, 52' at respectively determined times t1, t2. Therein, it is advantageous to provide plural sampling means 22, 22', 32, 32', 42, 42', 52, 52' for sampling the comparison signal c_out1, c_out2, c_out3, c_out4 of a comparator 21, 31, 41, 51. Since the mask points 2 and 3 or 5 and 6, respectively, are preset by the same threshold value VOH or VOL, respectively, in the present example, e.g. the second circuit portion 20 has a sampling means 22 for sampling the mask point 2 and another sampling means 22' for sampling the mask point 3, the signal inputs of which are each connected to the signal output of the second comparator 21. Since the two mask points 2 and 3 are sampled to respectively different times t1, t2, each one of the two sampling means 22, 22' has to be triggered via a separate control signal d_stb1, d_stb2. For this, the control inputs of the two sampling means 22, 22' are connected to the signal outputs of two different delay means 23, 23'. Therein, the delay means 23 has a first delay time Δt1 to effect sampling the data eye of the second comparison signal c_out1 by the sampling means 23 at the time t1. On the other hand, the delay means 23' of the sampling means 22' has a second delay time Δt2 to effect sampling the data eyes of the second comparison signal c_out1 by the sampling means 23' respectively at the time t2. Therein, preferably the first comparison signal d_sig respectively delayed by an individual delay time Δt1, Δt2 serves as the control signal d_stb1, d_stb2 of the two sampling means 22, 22'. The advantage therein is that the beginning of the respective data eye is respectively exactly marked by a signal edge of the first comparison signal d_sig. Thus, the signal edges of the first comparison signal d_sig can be used for setting a reference time t0 for each individual data eye. By way of the reference time t0 of a signal portion A-G and the corresponding preset delay time Δt1, Δt2, the associated sampling time t1, t2 can be determined very simply within the respective signal portion A-G.

The third circuit portion 30 has substantially the same construction as the second circuit portion 20. However, the positive signal branch sig+ of the output signal is now applied to the non-inverting signal input of the comparator 31, while the constant reference signal VOL is applied to the inverting signal input of the comparator 31. With the aid of the third circuit portion 30, it is verified if the sampling points 5 and 6 of the positive signal branch sig+ are not above the preset threshold value VOL. Therein, the inverted first comparison signal d_sig_n delayed by a first or a second period of time Δt1, Δt2, respectively, serves as the control signal d_stb1_n, d_stb2_n for the two sampling means 32, 32'.

The fourth circuit portion 40 is also constructed substantially analogously to the second circuit portion 20. Therein, the negative signal branch sig− of the output signal is applied to the inverting signal input of the comparator 41, while the constant reference signal VOH is applied to the non-inverting signal input. With the aid of the fourth signal portion 40 it is verified if the sampling points 2 and 3 of the negative signal branch sig− are not below the preset threshold value VOH. Similar to the third circuit portion 30, the inverted first comparison signal d_sig_n delayed by a first or a second period of time Δt1, Δt2, respectively, serves as the control signal d_stb1_n, d_stb2_n for the two sampling means 42, 42'.

Finally, also the fifth circuit portion 50 exhibits a construction substantially analogously to the circuit portions 20, 30, 40. Therein, the negative signal branch sig− of the output signal is applied to the non-inverting signal input of the comparator 51, while the constant reference signal VOL is applied to the inverting signal input. With the aid of the fifth circuit portion 50 it is verified if the sampling points 5 and 6 of the negative signal branch sig− are not above the preset threshold value VOL. Similar to the second circuit portion 20, the first comparison signal d_sig delayed by a first or a second period of time Δt1, Δt2, respectively, serves as the control signal d_stb1, d_stb2 for the two sampling means 52, 52'.

Since the sampling means 22, 52 or 22', 52' of the second and the fifth circuit portion 20, 50, respectively, are each triggered with the aid of the same control signal d_stb1 or d_stb2, respectively, they can also be controlled via a common delay member. The same applies to the sampling means 32, 42 or 32', 42', respectively.

If the compliance mask provides more additional sampling points having the same threshold value VOH, VOL as the sampling points 2 and 3 or 5 and 6, respectively, the circuit portions 20, 30, 40, 50 can have further sampling means and delay members, by the aid of which the signal level of the corresponding comparison signal c_out1, c_out2, c_out3, c_out4 at the corresponding times can be determined.

Further, FIG. 4 also shows an evaluation means 60 of the device according to the invention. The common evaluation means 60 preferably has each one separate signal input for each of the signal outputs of the sampling means 12, 12', 22, 22', 32, 32', 42, 42', 52, 52'. Fundamentally, signals of various sampling means can also utilize a common signal input of the evaluation means 60. However, the prerequisite for this is that the respective sampling means output their sampling results at different times.

The evaluation means 60 stores the incoming sampling results preferably in a register provided for this. In evaluation of the sampling results, each sampling result of the circuit portions 10, 20, 30, 40, 50 is separately evaluated by way of the default of the specification. Upon coincidence of all of the sampling results with the specification, the output signal of the evaluation means 60 indicates the result "pass". However, if at least one of the sampling results does not correspond to the default of the specification, the evaluation means 60 outputs the error signal "fail" at its signal output 61.

In order to verify further data eyes after effected evaluation, the evaluation means 60 has to be reset optionally. This can be effected e.g. by an external reset signal, that the evaluation means 60 receives through a corresponding reset signal input 62. However, it is also possible to provide an evaluation means 60 without special reset signal input 62, wherein resetting is effected automatically.

Figure 5:
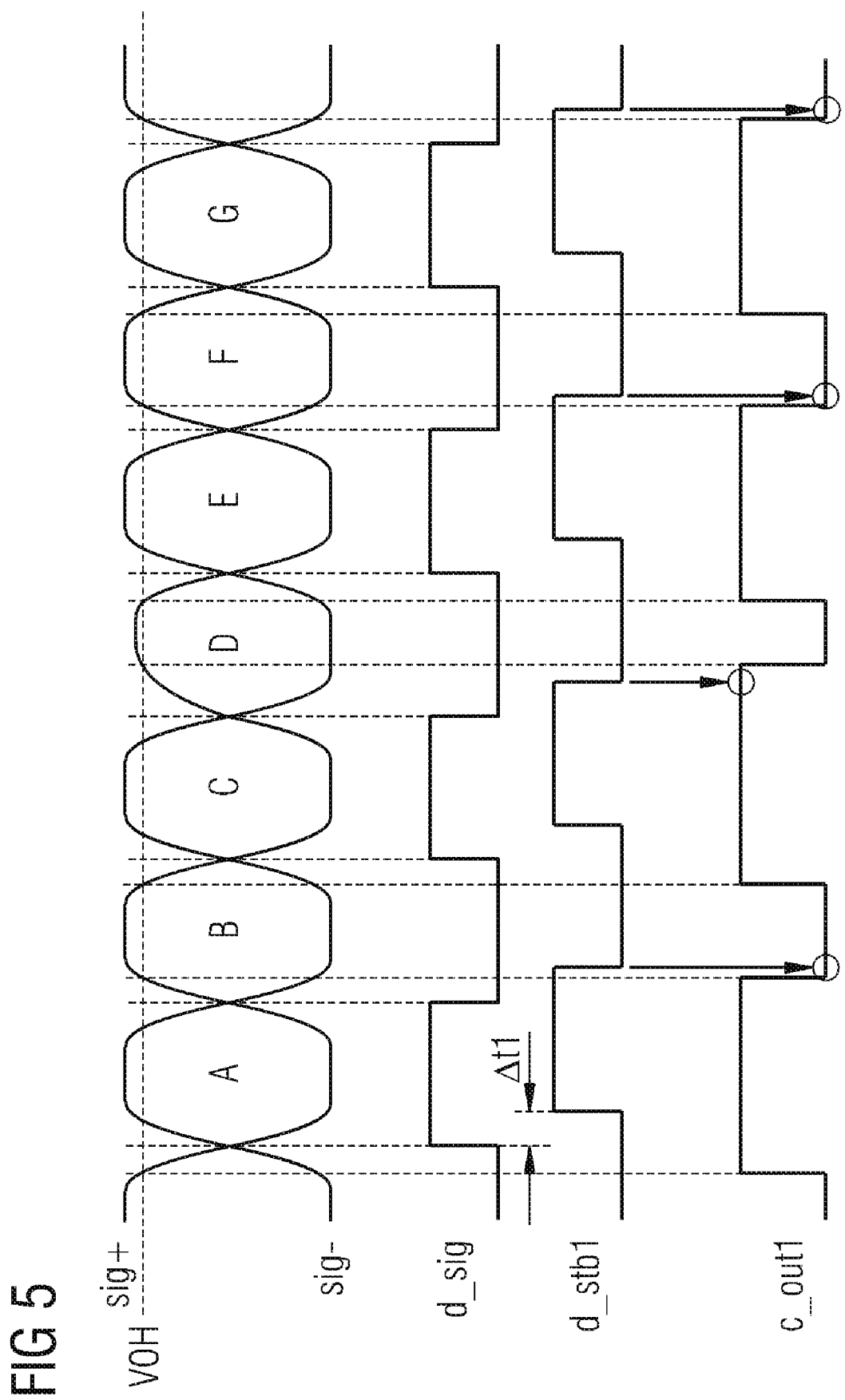
FIG. 5 illustrates exemplarily the temporal behaviour of the signals associated with a circuit portion of the device according to the invention for testing a preset signal level.

FIG. 5 shows exemplarily a possible behaviour of the signals of the sampling means 22 of the second circuit portion 20. Since the operation of the sampling means 22, 22', 32, 32', 42, 42', 52, 52' is substantially identical in the present example, a separate illustration is omitted. As already described in context with FIG. 3, in the upper portion of the diagram, a sequence of data eyes A-G is presented, which are constituted by the two signal branches sig+ and sig– of the output signal. Therein, also the upper threshold value VOH is drawn. As a result of the comparison of the positive signal branch sig+ of the output signal to the preset reference signal VOH, the second comparator 21 outputs a second comparison signal c_out1 at its signal output. It indicates, if the positive signal branch sig+ is above or below the preset reference signal VOH. The corresponding comparison signal c_out1 is illustrated in the lower portion of the diagram. Since the positive signal branch sig+ only is above the upper threshold value VOH in every other data eye B, D, F, the second comparison signal c_out1 has comparatively long "high" phases and comparatively short "low" phases. For controlling the sampling means 22 of the second circuit portion 20, the first comparison signal d_sig delayed by the preset period of time Δt1 is used, the edges of which are determined by the crossing points of the two signal branches sig+ and sig–. Therein, the sampling means 22 determines the actual signal level of the second comparison signal c_out1 respectively at the time t1 determined by the falling edge of the control signal d_stb1. In the present example, the sampling means 22 each determines a lower signal level of the second comparison signal c_out1 for the two data eyes B, F in this manner. Deviating from this, the sampling of the fourth data eye D at the time t1 determined by the falling edge of the control signal d_stb1 results in a high signal level of the second comparison signal c_out1. Due to this deviation from the default, the evaluation means 60 recognizes that the signal level of the positive signal branch sig+ has been below the upper threshold value VOH due to a signal deformation at the sampling time t1 of the respective signal portion preset by the mask point 2. Therefore, the evaluation means 60 will output an error signal in the fourth signal portion D, while "pass" is output as a result in the other two signal portions B and F.

Fundamentally, the concept according to the invention is also suitable for verifying if the signal level of a signal is within a preset range at a certain time. For this, a circuit portion can verify the corresponding signal if the signal level does not fall below the lower one of the two threshold values. At the same time, another circuit portion can verify if the signal level of the respective signal does not exceed the upper one of the two threshold values.

Figure 6:
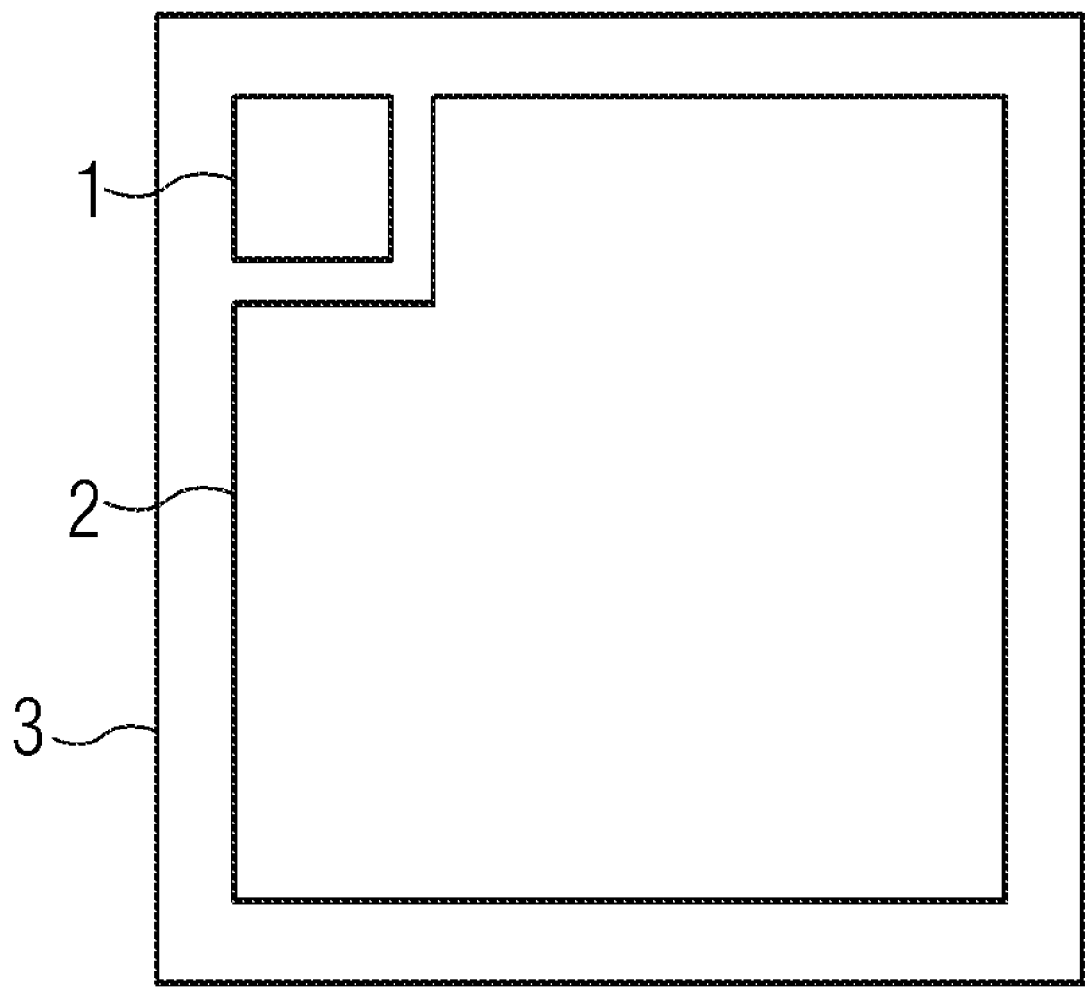
FIG. 6 shows a device according to the invention for testing an integrated circuit disposed on a semiconductor substrate together with the integrated circuit.

FIG. 6 shows the test device 1 according to the invention disposed on a semiconductor substrate 3 together with the integrated circuit 2. Therein, the test device 1 and the integrated circuit 2 are illustrated purely schematically without taking into account the actual dimensional ratios. The arrangement of the test device 1 on the chip of the integrated circuit is possible due to the very simple construction of the test device according to the invention. Therein, how the test device 1 is disposed on the chip depends primarily on the respective application case.

It is in the spirit of the invention not to restrict the device according to the invention to the test device disclosed in this description. Rather, according to the application case, the device according to the invention can also include only one of the circuit portions presented here. Further, also a device with another combination of the circuit portions or circuits described here, respectively, is conceivable. Similarly, the method according to the invention is not restricted to the method steps described here only exemplarily.

The features of the invention disclosed in the previous description, the claims and the drawings, can be substantial for realizing the invention in its various embodiments both individually and in any combination.

While the foregoing is directed to embodiments of the present invention, other and further embodiments of the invention may be devised without departing from the basic scope thereof, and the scope thereof is determined by the claims that follow.

What is claimed is:

1. A method for testing an integrated circuit, comprising:
   a) comparing a signal level of an output signal of the integrated circuit to a signal level of a first reference signal, thereby producing a first comparison signal having one of a first or a second value depending on whether the signal level of the output signal is above or below the signal level of the first reference signal, respectively;
   b) determining the value of the first comparison signal at a first certain time, wherein the first certain time is defined by a signal edge of the first comparison signal delayed by a first preset period of time;
   c) evaluating the value of the first comparison signal determined at the first certain time with respect to a default value; and
   d) outputting an evaluation signal.

2. The method according to claim 1, further comprising:
   verifying that a duration of a signal portion of the output signal limited by a first and a second signal edge of the first comparison signal does not fall below a preset minimum duration.

3. The method according to claim 2, wherein the first preset period of time, by which the first comparison signal is delayed, is shorter than the preset minimum duriation.

4. The method according to claim 3,
   wherein determining the value in step b) comprises sampling the first comparison signal at the first certain time by a first sampling means, wherein the value determined by the first sampling means is output, and wherein the sampling is triggered by a signal edge of a first control signal detected at a control input of the first sampling means, wherein the first control signal is the first comparison signal delayed by the first preset period of time.

5. The method according to claim 4,
wherein the first comparison signal is sampled by the first sampling means only at a rising or only at a falling signal edge of the first control signal, respectively; and wherein the first comparison signal and the first control signal are inverted and the inverted first comparison signal is sampled by a second sampling means, which is controlled, at least in part, by the inverted first control signal.

6. The method according to claim 5,
wherein an error signal is output as a result of the evaluating if the determined value of the first comparison signal does not correspond to the default value.

7. The method according to claim 6,
wherein the output signal and the first reference signal are formed as an inversely related signal pair of a differential signal, wherein at least one signal portion of the differential signal constitutes a data eye.

8. The method according to claim 7,
wherein steps a)-d) are performed within a specified set of tolerance limits of a functional test during manufacture of the integrated circuit.

9. The method according to claim 1, further comprising:
verifying that the signal level of the output signal does not fall below or exceed, respectively, a preset constant signal level at a time defined by a second preset period of time after a reference time;
wherein the signal level of the output signal is compared to the signal level of the first reference signal for determining the reference time, at which the first comparison signal has the signal edge,
wherein the signal level of the output signal is compared with the preset constant signal level of a second reference signal, and a second comparison signal is output, which has a first or a second value depending on whether the signal level of the output signal is above or below the preset constant signal level of the second reference signal, and
wherein the value of the second comparison signal is determined at a second certain time in step b).

10. The method according to claim 9,
wherein the first comparison signal is delayed by the second preset period of time for determining the second certain time, at which the value of the second comparison signal is determined, and wherein the second certain time is determined by a signal edge of the delayed first comparison signal.

11. The method according to claim 10,
wherein in step b) the second comparison signal is sampled by means of a third sampling means at the second certain time, and the value determined by the third sampling means is output, at which a signal edge of a second control signal is detected at a control input of the third sampling means, wherein the first comparison signal delayed by the second preset period of time serves as a second control signal.

12. The method according to claim 11,
wherein the second comparison signal is sampled only at a rising or only at a falling signal edge of the second control signal, and
wherein the first comparison signal is inverted and delayed by the second preset period of time for determining the second certain time, at which the value of the second comparison signal is determined, and wherein the second certain time is determined by a signal edge of the delayed, inverted first comparison signal.

13. The method according to claim 12,
wherein in step b) the second comparison signal is sampled by means of a fourth sampling means at the second certain time and the value determined by the fourth sampling means is output, at which second certain time a signal edge of a second control signal is detected at a control input of the fourth sampling means, wherein the inverted first comparison signal delayed by the second preset period of time serves as an inverted second control signal.

14. The method according to claim 13,
wherein the values of the first and the second comparison signals determined at the first and second certain periods of time, respectively, are evaluated by a common evaluation means, and wherein the common evaluation means outputs an error signal if at least one of the values of the first and second comparison signals does not correspond to the default value.

15. The method according to claim 14,
wherein steps a)-d) are performed within the specified set of tolerance limits of the functional test during manufacture of the integrated circuit.

16. A device for testing an integrated circuit, comprising:
a first comparator to compare a signal level of an output signal of the integrated circuit to a signal level of a first reference signal, wherein the first comparator is configured to output a first comparison signal, the first comparison signal having a first or a second value depending on whether the signal level of the output signal is above or below the signal level of the first reference signal;
a first sampling means to determine the value of the first comparison signal at a first certain time, wherein the first certain time is defined by a signal edge of the first comparison signal delayed by a first preset period of time; and
an evaluation circuit to evaluate the determined value of the first comparison signal determined at the first certain time with respect to a default value.

17. The device according to claim 16,
wherein the first comparator comprises a first signal input, a second signal input and a signal output, wherein the output signal of the integrated circuit is applied to the first signal input and the first reference signal is applied to the second signal input,
wherein the first sampling means comprises a signal input connected to the signal output of the first comparator, a control input and a signal output, and
further comprising a first adjustable delay means, comprising a signal input connected to the signal output of the first comparator and a signal output connected to the control input of the first sampling means,
wherein the first adjustable delay means is configured to delay the first comparison signal applied to its signal input by a first preset period of time, and then output the delayed first comparison signal as a first control signal at its signal output,
wherein the first sampling means is configured to determine the value of the first comparison signal applied to its signal input at the first certain time and to output the determined value of the first comparison signal via its signal output, wherein the first certain time is when a signal edge of the control signal is detected at the control input of the first sampling means,
wherein the evaluation circuit comprises a first signal input connected to the signal output of the first sampling means, and a signal output, and wherein the evaluation circuit is configured to evaluate the determined value of the first comparison signal with respect to the default value, and to output an error signal to its signal output when the determined value of the first comparison signal does not correspond to the default value.

18. The device according to claim 17, further comprising:
a second comparator that comprises a first signal input, a second signal input, and a signal output, wherein the second comparator is configured to compare the signal level of the output signal applied to its first signal input to a signal level of a second reference signal applied to its second signal input, wherein the signal level of the second reference signal is preset to a constant, and wherein the second comparator is configured to output a second comparison signal at its signal output, wherein the second comparison signal has a first or a second value depending on whether the signal level of the output signal is above or below the signal level of the second reference signal;
a second sampling means that comprises a signal input connected to the signal output of the second comparator, a control input and a signal output; and
a second adjustable delay means that comprises a signal input connected to the signal output of the first comparator and a signal output connected to the control input of the second sampling means, wherein the second adjustable delay means is configured to delay the first comparison signal applied to its signal input by a second preset period of time and then to output a second control signal at its signal output, wherein the second control signal is the first comparison signal delayed by the second preset period of time,
wherein the second sampling means is configured to determine a value of the second comparison signal applied to its signal input at a second certain time, and to output the determined value of the second comparison signal to its signal output, wherein the second certain time is when a signal edge of the second control signal is detected at its control input.

19. The device according to claim 18, further comprising:
a third sampling means that comprises a signal input, a control input and a signal output wherein the signal output of the second comparator is connected to the signal input of the third sampling means, wherein the third sampling means is configured to determine and output a value of the second comparison signal applied to its signal at a third certain time, wherein the third certain time is when a signal edge of a third control signal is detected at its control input; and
a third adjustable delay means that comprises a signal input and a signal output, wherein the control input of the third sampling means is connected to the signal output of the third adjustable delay means, wherein the signal inputs of the second and the third adjustable delay means are connected to the signal output of the first comparator, wherein the third adjustable delay means configured to delay the first comparison signal applied to its signal input by a third preset period of time and to output the third control signal to its signal output, wherein the third control signal is the first comparison signal delayed by the third preset period of time.

20. The device according to claim 19,
wherein the output of each one of the first, second, and third sampling means is connected to the first signal input, a second signal input, and a third signal input of the evaluation means, respectively, and wherein the evaluation means is configured to output the error signal on its signal output when the value of at least one of the comparison signals determined by any one of the first, second, and third sampling means does not correspond to the default value.

21. The device according to claim 20,
wherein the device is disposed on a semiconductor substrate together with the integrated circuit.

22. The device according to claim 16,
wherein the first comparator comprises a first signal input, a second signal input and a signal output, wherein the output signal of the integrated circuit is applied to the first signal input and the first reference signal is applied to the second signal input, wherein the first comparator is configured to output a first comparison signal at its signal output,
wherein the first sampling means comprises a signal input connected to the signal output of the first comparator, a control input and a signal output,
wherein the evaluation circuit comprises a plurality of signal inputs and a signal output, and
further comprising:
an additional sampling means that comprises a signal input, a control input and a signal output, wherein the signal input of the additional sampling means is connected to a signal output of a first inverter, wherein a signal input of the first inverter is connected to the signal output of the first comparator, and wherein the control input of the of the additional sampling means is connected to a signal output of a second inverter, wherein a signal input of the second inverter is connected to the signal output of the first adjustable delay means; and
a first adjustable delay means, comprising a signal input connected to the signal output of the first comparator and a signal output connected to the control input of the first sampling means,
wherein the first adjustable delay means is configured to delay the first comparison signal applied to its signal input by a first preset period of time and then output the delayed first comparison signal as a first control signal at its signal output,
wherein the first sampling means is configured to determine the value of the first comparison signal applied to its signal input at the first certain time and to output the determined value of the first comparison signal via its signal output, wherein the first certain time is when a signal edge of the first control signal is detected at its control input,
wherein the additional sampling means is configured to determine the value of the inverted first comparison signal applied to its signal input at the first certain time and to output the determined value of the inverted comparison signal to its signal output, wherein the first certain time is when a signal edge of the inverted first comparison signal delayed by the first preset period of time is detected at its control input,
wherein the output of each one of the first and the additional sampling means is connected to a first and a second of the plurality of signal inputs of the evaluation means,
and wherein the evaluation circuit is configured to output an error signal to its signal output when the value determined by at least one of the first or the additional sampling means does not correspond to the default value.

23. The device according to claim 22, further comprising:

a second comparator, comprising a first signal input, a second signal input and a signal output, to compare the signal level of the output signal applied to its first signal input to a signal level of a preset constant reference signal applied to its second signal input, wherein the second comparator is configured to output a second comparison signal at its signal output, which has a first or a second value depending on whether the signal level of the output signal is above or below the signal level of the preset constant reference signal;

a second sampling means that comprises a signal input connected to the signal output of the second comparator, a control input and a signal output; and a second adjustable delay means that comprises a signal input connected to the signal output of the first comparator and a signal output connected to the control input of the second sampling means, wherein the second adjustable delay means is configured to delay the first comparison signal applied to its signal input by a second preset period of time and to output the second control signal to its signal output, wherein the second control signal is the first comparison signal delayed by the second preset period of time, wherein the second sampling means is configured to determine the value of the second comparison signal applied to its signal input at a second certain time and to output the same to its signal output, wherein the second certain time is when a signal edge of the second control signal is detected at its control input.

24. The device according to claim 23, further comprising:

a third sampling means that comprises a signal input, a control input, and a signal output, wherein the signal output of the second comparator is connected to the signal input of the third sampling means; and a third adjustable delay means that comprises a signal input and a signal output, wherein the control input of the third sampling means is connected to the signal output of the third adjustable delay means, wherein the signal input of the third adjustable delay means is connected to the signal output of the first comparator, and wherein the third adjustable delay means is configured to delay the first comparison signal applied to its signal input by a third period of time and to output a third control signal to its signal output, wherein the third control signal is the first comparison signal delayed by the third period of time.

25. The device according to claim 24, wherein the output of each one of the second and third sampling means is connected to a third signal input and a fourth signal input of the evaluation means, respectively, and wherein the evaluation means is configured to output the error signal on its signal output when the value determined by either the first, the first additional, the second, or the third sampling means does not correspond to the default value.

26. The device according to claim 25, wherein the device is disposed on a semiconductor substrate together with the integrated circuit.

27. The device according to claim 16, wherein the first comparator comprises a first signal input, a second signal input and a signal output, wherein the output signal of the integrated circuit is applied to the first signal input, wherein the first reference signal is applied to the second signal input, wherein the first comparator outputs the first comparison signal at its signal output, and further comprising:

a first adjustable delay means, comprising a signal input connected to the signal output of the first comparator and a signal output connected to the signal output connected to the control input of the first sampling means, wherein the first adjustable delay means is configured to delay the first comparison signal applied to its signal input by a first preset period of time, and then output the delayed first comparison signal as a first control signal at its signal output;

a second comparator, comprising a first signal input, a second signal input and a signal output, to compare the signal level of the output signal applied to its first signal input to a signal level of a first preset constant reference signal applied to its second signal input, wherein the second comparator is configured to output a second comparison signal at its signal output, which has a first or a second value depending on whether the signal level of the output signal is above or below the signal level of the first preset constant reference signal;

a second sampling means that comprises a signal input connected to the signal output of the second comparator, a control input and a signal output; and a second adjustable delay means that comprises a signal input connected to the signal output of the first comparator and a signal output connected to the control input of the second sampling means, wherein the second adjustable delay means is formed to delay the first comparison signal applied to its signal input by a second preset period of time and to output a second control signal to its signal output, wherein the second control signal is the first comparison signal delayed by the second preset period of time, and wherein the second sampling means is formed to determine the value of the second comparison signal applied to its signal input at a second certain time, and to output the determined value to its signal output, wherein the second certain time is when a signal edge of the second control signal is detected at its control input.

28. The device according to claim 27, further comprising:

a third sampling means that comprises a signal input, a control input, and a signal output, wherein the signal output of the second comparator is connected to the signal input of the third sampling means; and a third adjustable delay means that comprises a signal input and a signal output, wherein the control input of the third sampling means is connected to the signal output of the third adjustable delay means, wherein the signal input of the third adjustable delay means is connected to the signal output of the first comparator, and wherein the third adjustable delay means is formed to delay the first comparison signal applied to its signal input by a third preset period of time and to output a third control signal to its signal output.

29. The device according to claim 28, wherein the output of each one of the second and third sampling means is connected to a second and a third signal input of the evaluation means, respectively, and wherein the evaluation means is formed to output an error signal on its signal output if the value determined by either the second or the third sampling means does not correspond to the default value.

30. The device according to claim 29,
wherein the device is disposed on a semiconductor substrate together with the integrated circuit.

31. The device according to claim 24, further comprising:
a third comparator, having a first signal input, a second signal input and a signal output, to compare the signal level of the output signal applied to its second signal input to a signal level of a second preset constant reference signal applied to its first signal input, and wherein the third comparator is formed to output a third comparison signal at its signal output, which has a first or a second value depending on whether the signal level of the output signal is above or below the signal level of the second preset constant reference signal;
a fourth and a fifth sampling means, each of the fourth and the fifth sampling means having a signal input connected to the signal output of the third comparator, a control input and a signal output; and
a fourth and a fifth adjustable delay means, each of the fourth and the fifth adjustable delay means having a signal input connected to the signal output of the first inverter and a signal output connected to the control input of one of the fourth or the fifth sampling means, wherein the fourth adjustable delay means is configured to delay the first comparison signal applied to its signal input by the second preset period of time and then output the delayed first comparison signal as a fourth control signal at its signal output, wherein the the fifth adjustable delay means is configured to delay the first comparison signal applied to its signal in put by the third preset period of time and then output the delayed first comparison signal as a fifth control signal at its signal output, and wherein the fourth and the fifth sampling means are configured to determine the value of the third comparison signal applied to their signal inputs at the second and the third certain times, respectively, and then to output the respective determine values at their signal outputs.

32. The device according to claim 24, further comprising:
a second circuit portion and a third circuit portion that are configured to determine the signal levels of a positive branch of the output signal, wherein the second circuit portion comprises the second comparator, the second and the third sampling means and the second and the third adjustable delay means, wherein the third circuit portion comprises the third comparator, the fourth and the fifth sampling means and the fourth and the fifth adjustable delay means; and
a fourth circuit portion and a fifth circuit portion having identical structures as the second circuit portion and the third circuit portion, respectively, wherein the fourth circuit portion and the fifth circuit portion are configured to determine the signal levels of a negative branch of the output signal.

33. The device according to claim 32,
wherein the output of each one of the sampling means is connected to a respective signal input of the evaluation means,
and wherein the evaluation means is configured to output the error signal on its signal output when the value determined by any of the sampling means does not correspond to the default value.

34. The device according to claim 33,
wherein the device is disposed on a semiconductor substrate together with the integrated circuit.

* * * * *